United States Patent
Tsai et al.

(10) Patent No.: US 10,644,869 B2
(45) Date of Patent: *May 5, 2020

(54) AUTOMATIC DETECTION OF CHANGE IN PLL LOCKING TREND

(71) Applicant: Taiwan Semiconductor Manufacturing Co., Ltd., Hsinchu (TW)

(72) Inventors: Tsung-Hsien Tsai, Zhongli (TW); Chih-Hsien Chang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/549,690

(22) Filed: Aug. 23, 2019

(65) Prior Publication Data

US 2019/0379525 A1    Dec. 12, 2019

Related U.S. Application Data

(63) Continuation of application No. 16/107,596, filed on Aug. 21, 2018, now Pat. No. 10,439,794, which is a
(Continued)

(51) Int. Cl.
*H04L 7/033* (2006.01)
*H03L 7/099* (2006.01)
(Continued)

(52) U.S. Cl.
CPC ............ *H04L 7/0331* (2013.01); *H03L 7/091* (2013.01); *H03L 7/093* (2013.01); *H03L 7/0994* (2013.01); *H03L 2207/50* (2013.01)

(58) Field of Classification Search
CPC ....... H04L 7/033; H04L 7/0331; H03L 7/087; H03L 7/0891; H03L 7/0814; H03L 7/091; H03L 7/0994; H03L 7/093; H03L 2207/50
(Continued)

(56) References Cited

U.S. PATENT DOCUMENTS

| | | | | |
|---|---|---|---|---|
| 4,376,268 A | * | 3/1983 | Moriya | ..................... H03L 7/06 331/10 |
| 4,633,488 A | * | 12/1986 | Shaw | ..................... H04L 7/033 327/157 |

(Continued)

*Primary Examiner* — James M Perez
(74) *Attorney, Agent, or Firm* — Sterne, Kessler, Goldstein & Fox P.L.L.C.

(57) ABSTRACT

A phase lock loop (PLL), such as an all digital phase lock loop (ADPLL) to provide an example, of the present disclosure operates in a frequency tracking mode to adjust a frequency of the output signal to be proportional to a frequency of a reference input signal, or, in a phase tracking mode to adjust a phase of the output signal to match any variations in the reference input signal. The ADPLL includes a phase and/or frequency detector that provides an error signal representing a difference, in frequency and/or phase, between the output signal and the reference input signal. The ADPLL monitors a trend of the error signal, such as a positive trend, a negative trend, or a flat trend to provide some examples, and switches among the frequency tracking mode and the phase tracking mode upon detecting a change in the trend of the error signal.

20 Claims, 5 Drawing Sheets

Related U.S. Application Data continuation of application No. 15/845,193, filed on Dec. 18, 2017, now Pat. No. 10,090,994, which is a continuation of application No. 15/135,212, filed on Apr. 21, 2016, now Pat. No. 9,853,807.

(51) Int. Cl.
*H03L 7/091* (2006.01)
*H03L 7/093* (2006.01)

(58) Field of Classification Search
USPC .................................................. 375/354–376
See application file for complete search history.

(56) References Cited

U.S. PATENT DOCUMENTS

| | | | | |
|---|---|---|---|---|
| 5,184,092 A * | 2/1993 | Shahriary | H03L 7/0994 | 331/16 |
| 5,512,860 A * | 4/1996 | Huscroft | H03L 7/087 | 331/1 A |
| 5,790,613 A * | 8/1998 | Tateishi | H04L 7/033 | 375/317 |
| 5,978,425 A * | 11/1999 | Takla | H03L 7/093 | 327/159 |
| 6,175,725 B1 * | 1/2001 | Auber | G01S 19/29 | 342/357.68 |
| 7,020,791 B1 * | 3/2006 | Aweya | G06F 1/12 | 327/141 |
| 7,130,368 B1 * | 10/2006 | Aweya | H03L 7/085 | 375/376 |
| 7,145,399 B2 * | 12/2006 | Staszewski | H03L 7/093 | 331/17 |
| 7,398,071 B2 * | 7/2008 | Jensen | H03L 7/0891 | 331/15 |
| 7,483,508 B2 * | 1/2009 | Staszewski | H03L 7/085 | 327/147 |
| 7,630,468 B2 * | 12/2009 | Miller | H03L 7/07 | 327/147 |
| 7,715,514 B2 * | 5/2010 | Takeuchi | H03L 7/0814 | 327/160 |
| 7,734,000 B2 * | 6/2010 | Kuo | H03L 7/087 | 375/360 |
| 7,791,417 B2 * | 9/2010 | Wang | H03L 7/087 | 331/18 |
| 7,860,205 B1 * | 12/2010 | Aweya | H03L 7/093 | 370/497 |
| 7,885,353 B2 * | 2/2011 | Nakadaira | H04B 15/04 | 327/114 |
| 7,888,973 B1 * | 2/2011 | Rezzi | H03L 7/085 | 327/105 |
| 7,932,784 B1 * | 4/2011 | Janesch | H03L 7/087 | 331/10 |
| 7,974,375 B2 * | 7/2011 | Kim | H03L 7/0891 | 327/235 |
| 8,058,917 B2 * | 11/2011 | Mayer | H03L 7/093 | 327/158 |
| 8,090,068 B2 * | 1/2012 | Sun | H03L 7/085 | 375/376 |
| 8,106,808 B1 * | 1/2012 | Cohen | G04F 10/005 | 341/155 |
| 8,193,842 B2 * | 6/2012 | Min | H03L 7/085 | 327/147 |
| 8,249,129 B2 * | 8/2012 | Fudge | H04B 1/7136 | 341/152 |
| 8,306,176 B2 * | 11/2012 | Staszewski | H03L 7/087 | 327/147 |
| 8,331,519 B2 * | 12/2012 | Zhidkov | G01R 23/10 | 327/156 |
| 8,358,729 B2 * | 1/2013 | Bae | H03L 7/093 | 327/155 |
| 8,368,437 B2 * | 2/2013 | Huang | H03L 7/089 | 327/147 |
| 8,433,025 B2 * | 4/2013 | Sun | H03L 7/087 | 327/156 |
| 8,456,207 B1 * | 6/2013 | Kuo | H03L 7/095 | 327/147 |
| 8,536,916 B1 * | 9/2013 | van Engelen | H03L 7/099 | 327/150 |
| 8,547,151 B2 * | 10/2013 | Kuo | H03L 7/07 | 327/148 |
| 8,565,336 B2 * | 10/2013 | Lim | H04L 27/183 | 375/260 |
| 8,570,082 B1 * | 10/2013 | Kuo | H03L 1/00 | 327/158 |
| 8,593,189 B1 * | 11/2013 | Yen | H03L 7/085 | 327/147 |
| 8,598,929 B1 * | 12/2013 | Wicpalek | H03L 7/093 | 327/147 |
| 8,638,146 B1 * | 1/2014 | Lamanna | H03L 7/085 | 327/156 |
| 8,643,414 B1 * | 2/2014 | Navid | H03L 7/10 | 327/147 |
| 8,681,912 B2 * | 3/2014 | Park | H04L 25/0228 | 375/232 |
| 8,890,626 B2 * | 11/2014 | Chen | H03K 3/0315 | 327/156 |
| 8,957,705 B2 * | 2/2015 | Jia | G04F 10/005 | 327/3 |
| 9,065,454 B2 * | 6/2015 | Lin | H03L 7/087 | |
| 9,071,415 B2 * | 6/2015 | Takeuchi | H04L 7/0331 | |
| 9,112,507 B2 * | 8/2015 | Chen | H03L 7/101 | |
| 9,160,351 B2 * | 10/2015 | Chen | H03L 7/091 | |
| 9,197,403 B2 * | 11/2015 | Gauthier | H04L 7/0331 | |
| 9,257,998 B2 * | 2/2016 | Tsai | H03L 7/093 | |
| 9,319,053 B2 * | 4/2016 | Kuo | H03L 7/093 | |
| 9,385,731 B2 * | 7/2016 | Kuo | H03L 7/093 | |
| 9,432,176 B2 * | 8/2016 | Yu | H04L 7/0025 | |
| 9,455,823 B2 * | 9/2016 | Hsu | H03L 7/0996 | |
| 9,496,882 B2 * | 11/2016 | Tsai | H03K 3/011 | |
| 9,621,171 B1 * | 4/2017 | Tsai | H03K 7/06 | |
| 9,853,807 B2 * | 12/2017 | Tsai | H03L 7/091 | |
| 10,090,994 B2 * | 10/2018 | Tsai | H03L 7/093 | |
| 10,164,649 B2 * | 12/2018 | Tsai | H03L 7/087 | |
| 10,389,371 B1 * | 8/2019 | Perrott | H03L 7/087 | |
| 10,439,794 B2 * | 10/2019 | Tsai | H03L 7/093 | |
| 10,523,221 B2 * | 12/2019 | Tsai | H03L 7/113 | |
| 2002/0080898 A1 * | 6/2002 | Agazzi | H03M 1/0624 | 375/355 |
| 2002/0191727 A1 * | 12/2002 | Staszewski | H03C 3/0966 | 375/376 |
| 2003/0133522 A1 * | 7/2003 | Staszewski | H03L 7/085 | 375/345 |
| 2003/0141936 A1 * | 7/2003 | Staszewski | H03L 7/085 | 331/16 |
| 2003/0234693 A1 * | 12/2003 | Staszewski | H03L 7/093 | 331/16 |
| 2003/0235262 A1 * | 12/2003 | Staszewski | H03L 7/087 | 375/376 |
| 2004/0032883 A1 * | 2/2004 | Knapp | H04J 3/0647 | 370/509 |
| 2004/0032922 A1 * | 2/2004 | Knapp | H04J 3/0647 | 375/356 |
| 2004/0252804 A1 * | 12/2004 | Aoyama | H03D 13/004 | 375/376 |
| 2005/0186920 A1 * | 8/2005 | Staszewski | H03L 7/16 | 455/114.1 |
| 2006/0062341 A1 * | 3/2006 | Edmondson | H03L 7/0814 | 375/376 |
| 2006/0135105 A1 * | 6/2006 | Jensen | H03L 7/0891 | 455/260 |
| 2007/0075785 A1 * | 4/2007 | Kossel | H03L 7/089 | 331/16 |
| 2007/0188242 A1 * | 8/2007 | Song | H03L 7/0898 | 331/16 |
| 2008/0068236 A1 * | 3/2008 | Sheba | G04F 10/005 | 341/118 |
| 2008/0187083 A1 * | 8/2008 | Tapie | H03L 7/085 | 375/371 |

(56) References Cited

U.S. PATENT DOCUMENTS

| | | | |
|---|---|---|---|
| 2008/0315928 A1* | 12/2008 | Waheed | G04F 10/005 327/159 |
| 2009/0141845 A1* | 6/2009 | Ballantyne | H03L 7/085 375/376 |
| 2009/0175399 A1* | 7/2009 | Sun | H03L 7/0802 375/376 |
| 2009/0256601 A1* | 10/2009 | Zhang | H03L 7/085 327/156 |
| 2009/0262877 A1* | 10/2009 | Shi | H03L 1/022 375/376 |
| 2009/0309664 A1* | 12/2009 | Gotz | H03L 7/085 331/16 |
| 2009/0310730 A1* | 12/2009 | Zhidkov | G01R 23/10 375/376 |
| 2010/0134156 A1* | 6/2010 | Lin | H03L 7/08 327/156 |
| 2010/0195779 A1* | 8/2010 | Sai | H03L 7/087 375/376 |
| 2010/0244971 A1* | 9/2010 | Wang | G04F 10/005 331/1 A |
| 2011/0007859 A1* | 1/2011 | Ueda | H03L 7/0802 375/376 |
| 2011/0050301 A1* | 3/2011 | Perrott | H03H 19/008 327/156 |
| 2011/0156783 A1* | 6/2011 | Pavlovic | H03L 7/081 327/159 |
| 2011/0164675 A1* | 7/2011 | Senoue | H03L 7/087 375/240.01 |
| 2012/0032718 A1* | 2/2012 | Chan | H03L 7/093 327/156 |
| 2012/0056769 A1 | 3/2012 | Wang et al. | |
| 2012/0133405 A1* | 5/2012 | Jain | H03L 3/00 327/159 |
| 2013/0113528 A1* | 5/2013 | Frantzeskakis | H03L 7/10 327/117 |
| 2013/0147529 A1* | 6/2013 | Ganesan | H03L 7/1803 327/156 |
| 2013/0285722 A1* | 10/2013 | Chou | H03L 7/0898 327/157 |
| 2014/0077841 A1* | 3/2014 | Jia | G04F 10/005 327/3 |
| 2014/0145769 A1* | 5/2014 | Lin | H03L 7/087 327/158 |
| 2014/0232473 A1* | 8/2014 | Matsuda | H03L 7/091 331/8 |
| 2015/0015308 A1* | 1/2015 | Da Dalt | H03L 7/093 327/106 |
| 2015/0102845 A1* | 4/2015 | Tsai | H03L 7/093 327/159 |
| 2015/0162921 A1* | 6/2015 | Chen | H03L 7/087 327/157 |
| 2015/0162922 A1* | 6/2015 | Song | H04L 7/0091 375/376 |
| 2015/0188553 A1* | 7/2015 | Familia | H03L 7/097 327/5 |
| 2015/0194971 A1* | 7/2015 | Tsai | H03L 7/085 327/142 |
| 2015/0288370 A1* | 10/2015 | Deng | H03L 7/0997 327/158 |
| 2015/0311902 A1* | 10/2015 | Tsai | H03L 1/00 331/17 |
| 2016/0020775 A1* | 1/2016 | Kuo | H03L 7/093 327/159 |
| 2016/0072514 A1* | 3/2016 | Tsai | H03K 3/011 331/47 |
| 2016/0087639 A1* | 3/2016 | Wicpalek | H03L 7/1976 327/154 |
| 2016/0204787 A1* | 7/2016 | Lotfy | H03L 7/085 327/142 |
| 2016/0226656 A1* | 8/2016 | Okada | H03L 7/22 |
| 2016/0241301 A1* | 8/2016 | Pavlovic | H03C 3/0933 |
| 2016/0308541 A1* | 10/2016 | Liu | H03L 7/0992 |
| 2017/0012631 A1* | 1/2017 | Dato | H03L 7/091 |
| 2017/0075370 A1* | 3/2017 | Satoh | H03L 7/146 |
| 2017/0117907 A1* | 4/2017 | Grollitsch | H03L 7/0995 |
| 2017/0205772 A1* | 7/2017 | Burg | H03L 7/091 |
| 2017/0310457 A1* | 10/2017 | Tsai | H04L 7/0331 |
| 2017/0373697 A1* | 12/2017 | Schober | H03L 7/24 |
| 2018/0006849 A1* | 1/2018 | Jang | H03L 7/081 |
| 2018/0062660 A1* | 3/2018 | van den Heuvel | H03L 7/087 |
| 2018/0097522 A1* | 4/2018 | Chillara | H03K 4/90 |
| 2018/0109370 A1* | 4/2018 | Tsai | H03L 7/093 |
| 2018/0152192 A1* | 5/2018 | Tsai | H03L 7/087 |
| 2019/0058575 A1* | 2/2019 | Tsai | H03L 7/091 |
| 2019/0158102 A1* | 5/2019 | Tsai | H03L 7/087 |

\* cited by examiner

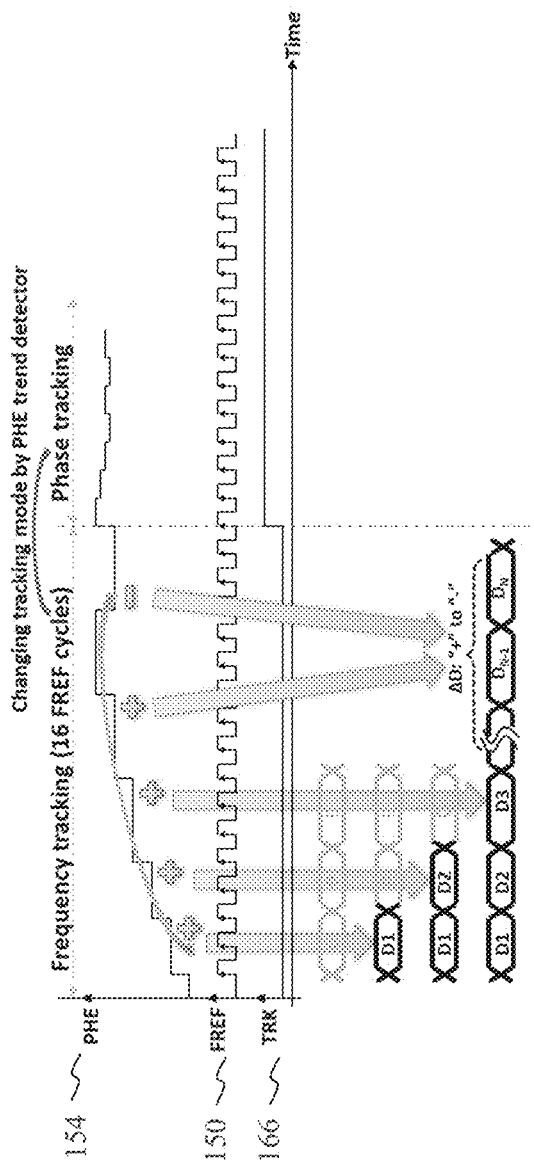
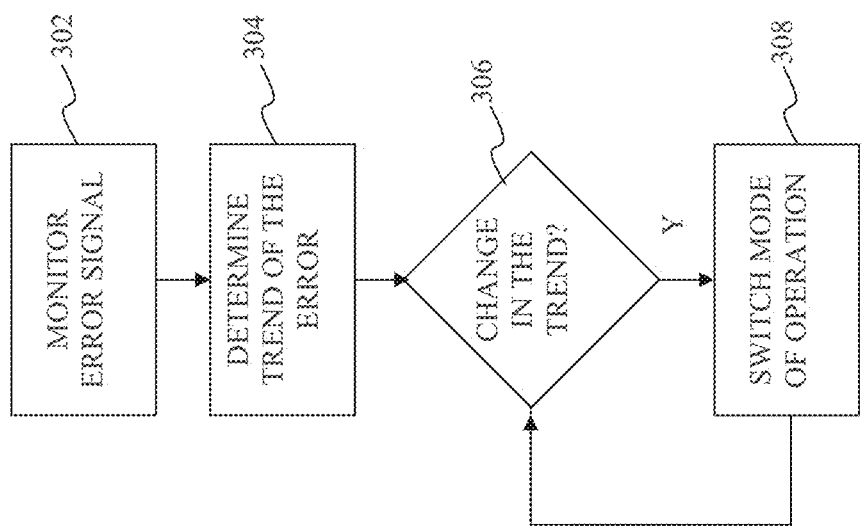
FIG. 3A
FIG. 3B

AUTOMATIC DETECTION OF CHANGE IN PLL LOCKING TREND

CROSS-REFERENCE TO RELATED APPLICATIONS

The present application is a continuation of U.S. patent application Ser. No. 16/107,596, filed Aug. 21, 2018, which is a continuation of U.S. patent application Ser. No. 15/845,193, filed Dec. 18, 2017, which is a continuation of U.S. patent application Ser. No. 15/135,212, filed Apr. 21, 2016, now U.S. Pat. No. 9,853,807, each of which is incorporated herein by reference in its entirety.

BACKGROUND

Phase lock loops (PLLs) generate output signals whose phases are related to the phases of the input signals. For example, a PLL can be used to adjust an oscillator so that a frequency and phase of a signal generated by the oscillator matches the frequency and phase of a reference input signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In the drawings:

FIG. 3A is a timing diagram illustrating a change of tracking mode based on a change in trend in accordance with an embodiment of the present disclosure;

FIG. 3B is a flowchart illustrating a method of changing tracking mode based on determining a change in the trend of the error signal in accordance with an embodiment of the present disclosure;

DETAILED DESCRIPTION

Figure 1:
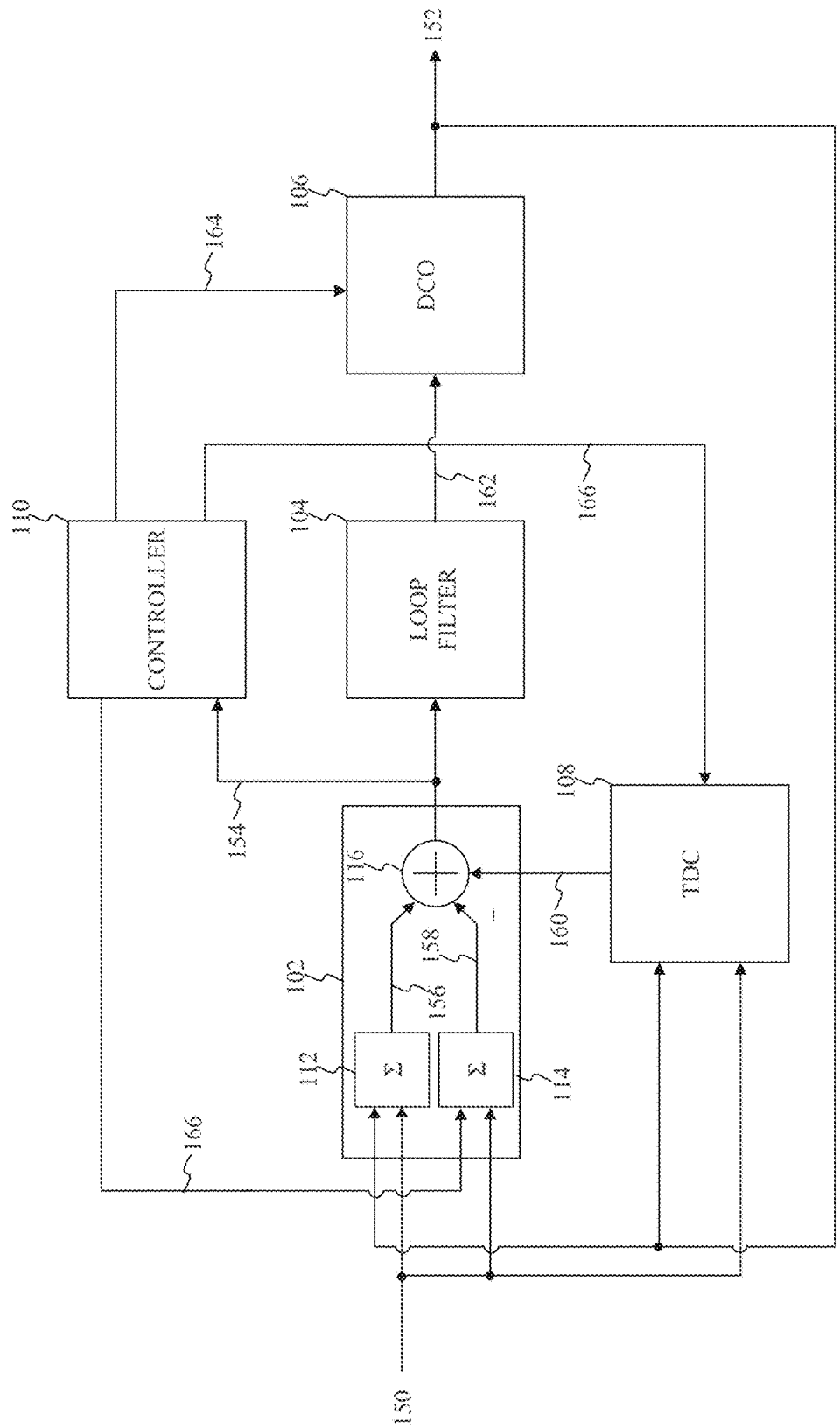
FIG. 1 is a block diagram of an exemplary ADPLL 100 according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

A phase lock loop (PLL), such as an all digital phase lock loop (ADPLL) to provide an example, of the present disclosure can be used to adjust its oscillator so that a frequency and/or a phase of an output signal generated by the oscillator is proportional to a frequency and/or a phase of a reference input signal. The PLL includes a phase and/or frequency detector that provides an error signal representing a difference, in frequency and/or phase, between the output signal and the reference input signal. This error signal can be measured to ensure that the frequency and/or the phase of the output signal is proportional to the frequency and/or the phase of the reference signal. For example, as the PLL adjusts the oscillator, the frequency and/or the phase of the output signal can gradually become closer to the frequency of the reference input signal. When the frequency and the phase of the output signal is proportional to the frequency and/or the phase of the reference input signal, the PLL is said to be locked onto the reference input signal. The time it takes for the frequency and/or phase of the output signal to become proportional to the frequency and/or the phase of the reference input signal can be referred to as the locking time.

In an embodiment, the PLL operates in a frequency tracking mode to adjust the frequency of the output signal to be proportional to a frequency of the reference input signal, or, in a phase tracking mode to adjust a phase of the output signal to match any variations in the reference input signal. Often times, the error signal includes a frequency component representing a difference in frequency between the reference input signal and the output signal and a phase component representing a difference in phase between the reference input signal and the output signal. The PLL adjusts a frequency of the output signal to minimize the frequency component of the error signal when in the frequency tracking mode. In this exemplary embodiment, when the frequency component of the error signal has been minimized, the tracking mode of the PLL can be switched from the frequency tracking mode to the phase tracking mode. The PLL adjusts a phase of the output signal to minimize the phase component of the error signal when in the phase tracking mode while the oscillator is locked onto the reference input signal.

Exemplary all Digital Phase Lock Loop (ADPLL)

FIG. 1 is a block diagram of an exemplary ADPLL 100 according to an exemplary embodiment of the present disclosure. A digital reference input signal 150 represents a digital representation of a first time-varying signal, such as a cosine wave or a sine wave to provide some examples, having a frequency $f_{REF}$ and a phase $\phi_{REF}$. Similarly, a digital output signal 152 represents a digital representation of a second time-varying signal having a frequency $f_{OUT}$ and a phase $\phi_{OUT}$. Herein, the frequency $f_{REF}$ and the phase $\phi_{REF}$ of the first time-varying signal is referred to as the $f_{REF}$ and the phase $\phi_{REF}$, respectively. Similarly, the frequency $f_{OUT}$ and the phase $\phi_{OUT}$ of the second time-varying signal is referred to as the $f_{OUT}$ and the phase $\phi_{OUT}$, respectively. An ADPLL 100 adjusts the digital output signal 152 such that the frequency $f_{OUT}$ and/or the phase $\phi_{OUT}$ is proportional to the frequency $f_{REF}$ and/or the phase $\phi_{REF}$. The ADPLL 100 can to operate in a frequency tracking mode of operation to adjust the frequency $f_{OUT}$ to be proportional to the frequency $f_{REF}$ or in a phase tracking mode of operation to adjust the phase $\phi_{OUT}$ to match, or substantially match, the phase $\phi_{REF}$. The ADPLL 100 can be implemented using a phase frequency detector (PFD) 102, a digital loop filter 104, a digital controlled oscillator (DCO) 106, and a time-to-digital converter (TDC) 108, and a controller 110. The PFD 102, the loop filter 104, the DCO 106, the TDC 108, and the digital combination network 116 can be implemented using digital components to form an all-digital PLL (ADPLL).

The PFD 102 compares the frequency $f_{OUT}$ and the frequency $f_{REF}$ to provide an error signal 154. The error signal 154 includes a frequency component representing a first difference between the frequency $f_{REF}$ and the frequency $f_{OUT}$ and a phase component representing a second difference between the phase $\phi_{REF}$ and the phase $\phi_{OUT}$. As illustrated in FIG. 1, the PFD 102 includes a DCO accumulator 112, a reference accumulator 114, and a digital combination network 116. The DCO accumulator 112 accumulates the digital reference input signal 150 and the digital output signal 152 to provide a digital output value 156. The reference accumulator 114 accumulates the digital reference input signal 150 and a digital data signal 166, which is to be discussed in further detail below, to provide a digital reference input value 158. The digital combination network 116 determines a difference between the digital output value 156 and the digital reference input value 158 to provide the frequency component of the error signal 154 when the ADPLL 100 is operating in the frequency tracking mode of operation and the phase tracking mode of operation. Additionally, when the ADPLL 100 is operating the phase tracking mode of operation, the digital combination network 116 additionally combines a phase difference 160 representing the second difference between the phase $\phi_{REF}$ and the phase $\phi_{OUT}$, which is to be discussed in further detail below, to provide the phase component of the error signal 154.

The digital loop filter 104 provides a fine digital tuning word 162 in response to the error signal 154. In a similar manner as the digital reference input signal 150 and/or the digital output signal 152, the error signal 154 represents a digital representation of a third time-varying signal. The digital loop filter 104 suppresses high frequency components in the third time-varying signal which are outside of its bandwidth to provide samples of a direct current (DC), or near DC, component of the third time-varying signal within its bandwidth as the fine digital tuning word 162.

The DCO 106 adjusts the frequency $f_{OUT}$ and/or the phase $\phi_{OUT}$ in accordance with the fine digital tuning word 162 and the coarse tuning word 164. The coarse tuning word 164 coarsely tunes the frequency $f_{OUT}$ to be within a locking range of the ADPLL 100. The locking range of the ADPLL 100 represents a range of the frequency $f_{OUT}$ that is sufficiently close to the frequency $f_{REF}$ such that the ADPLL 100 can lock onto the digital reference input signal 150 using the fine digital tuning word 162. The fine digital tuning word 162 can be used by the DCO 106 to adjust the frequency $f_{OUT}$ and the phase $\phi_{OUT}$ to match any variations in the frequency $f_{REF}$ and the phase $\phi_{REF}$.

The TDC 108 determines various timing characteristics of the digital reference input signal 150 and the digital output signal 152 to provide the phase difference 160 representing the second difference between the phase $\phi_{REF}$ and the phase $\phi_{OUT}$. For example, the TDC 108 determines a first start time of the digital reference input signal 150 and/or a first stop time of the digital reference input signal 150. The TDC similarly determines a second start time of the digital output signal 152 and/or a second stop time of the digital output signal 152. Thereafter, the TDC compares the first start time and the second start time and/or the first stop time and the second stop time to determine the phase difference 160. The TDC 108 can be disabled in the frequency tracking mode by setting a TDC enable signal 166 to a first logical level, such as a logical zero to provide an example, and/or can be enabled in the phase tracking mode by setting the TDC enable signal 166 to a second logical level, such as a logical one to provide an example.

The controller 110 controls the overall configuration and operation of the ADPLL 100. The controller 110 configures the ADPLL 100 to operate in the frequency tracking mode of operation. In the frequency tracking mode of operation, the controller 110 disables the TDC 108 by setting the TDC enable signal 166 to the first logical level. The DCO 106 adjusts the digital output signal 152 to adjust the frequency $f_{OUT}$ in the frequency tracking mode. Thereafter, the controller 110 monitors the error signal 154 to determine a trend, for example, a positive trend, a flat trend, and/or a negative trend in the error signal 154. The positive trend indicates a digital value of the error signal 154 is increasing from a previous value of the error signal 154, the flat trend indicates the digital value of the error signal 154 is substantially unchanged from the previous value of the error signal 154, and the negative trend indicates the digital value of the error signal 154 is decreasing from the previous value of the error signal 154. Once the controller 110 detects a first change in the trend of the error signal, for example, from the positive trend to the flat trend or the negative trend to the flat trend, the controller 110 configures the ADPLL 100 to operate in the phase tracking mode of operation. The first change in the trend of the error signal 154 indicates the frequency $f_{REF}$ is sufficiently close to the frequency $f_{OUT}$ to allow the DCO 106 to lock onto the reference input signal 150 in the phase tracking mode of operation.

In the phase tracking mode of operation, the controller 110 enables the TDC 108 by setting the TDC enable signal 166 to the second logical level. The DCO 106 adjusts the digital output signal 152 to adjust the phase $\phi_{OUT}$ in the phase tracking mode. When the phase component of the error signal 154 is minimized, the phase $\phi_{OUT}$ is sufficiently close to the phase $\phi_{REF}$. In this situation, the DCO 106 is locked onto the reference input signal 150 to match any variations in the frequency $f_{REF}$ and the phase $\phi_{REF}$. Thereafter, the controller 110 continues to monitor the error signal 154 to determine the trend. Once the controller 110 detects a second change in the trend of the error signal, for example, from the flat trend to the positive trend or the flat trend to the negative trend, the controller 110 configures the ADPLL 100 to operate in the frequency tracking mode of operation. The second change in the trend of the error signal 154 indicates the frequency $f_{REF}$ is no longer sufficiently close to the frequency $f_{OUT}$ to allow the DCO 106 to lock onto the reference input signal 150.

Additionally, the controller 110 provides the coarse tuning word 164 to coarsely steer the frequency of the DCO 106. Typically, the controller 110 can perform a calibration routine to determine the coarse tuning word 164 corresponding to a desired frequency $f_{OUT}$. For example, the controller 110 may cycle through different combinations of the coarse tuning word 164 using a searching algorithm, such as a binary search tree algorithm, a recursion algorithm, a Stern-Brocot algorithm and/or any other suitable search that will be apparent to those skilled in the relevant art(s) without departing from the spirit and scope of the present disclosure to produce the desired frequency $f_{OUT}$.

Further, the controller 110 provides the digital data signal 166 representing a digital representation of a fourth time-varying signal having a frequency $f_{DATA}$. The frequency $f_{DATA}$ is approximately equal to the frequency $f_{OUT}$. In an exemplary embodiment, the digital data signal 166 represents information to be modulated by the ADPLL 100 onto the digital output signal 152. This allows the ADPLL 100 to lock onto the digital reference input signal 150 when the frequency $f_{OUT}$ is an integer multiple of the frequency $f_{REF}$ without using a digital divider to divide the frequency $f_{OUT}$.

Exemplary PLL Tracking Modes

Figure 2:
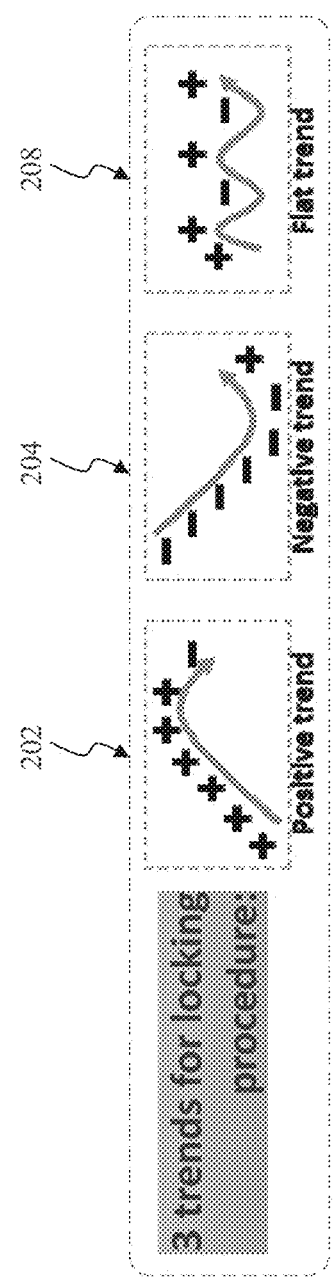
FIG. 2 is a diagram illustrating trends of an error signal in accordance with an embodiment of the present disclosure.

FIG. 2 is a diagram illustrating trends of an error signal accordance with an embodiment of the present disclosure. As discussed above, the controller 110 monitors the error signal 154 to determine a trend, for example, a positive trend, a flat trend, and/or a negative trend in the error signal 154. As the frequency $f_{OUT}$ and the frequency $f_{REF}$ converge, the error signal 154 decreases, and the error signal 154 increases when the frequency $f_{OUT}$ and the frequency $f_{REF}$ diverge. As shown in FIG. 2, the error signal 154 can have a positive trend 202, for example, as the frequency $f_{OUT}$ converges with the frequency $f_{REF}$. The error signal 154 can have a negative trend 204, for example, as the frequency $f_{OUT}$ diverges from the frequency $f_{REF}$. The error signal 154 can have a flat trend 208, for example, when the frequency $f_{OUT}$ is approximately proportional to the frequency $f_{REF}$. In accordance with an embodiment of the present disclosure, when ADPLL 100 detects a change in trend (e.g., from the positive trend 202 to the flat trend 208), the controller 110 can initiate the change in the tracking mode.

Exemplary Operation of the Controller of the ADPLL

FIG. 3A is a timing diagram illustrating a change of tracking mode based on a change in trend of the error signal, in accordance with an embodiment of the present disclosure. As discussed above, the controller 110 detects a change in the trend of the error signal 154, for example, from the flat trend 208 to the positive trend 202 or the flat trend 208 to the negative trend 204, and changes tracking mode from frequency tracking mode to phase tracking mode based on the change.

FIG. 3B is a flowchart illustrating an exemplary operational control flow of the controller 110 that detects a change in the trend of error signal and changes tracking mode based on the change. The controller 110 is not limited to this operational control flow. Rather, it will be apparent to ordinary persons skilled in the relevant art(s) that other operational control flows are within the scope and spirit of the present disclosure.

At step 302 as illustrated in FIG. 3B, the operational control flow monitors the error signal 154. In an exemplary embodiment, the operational control flow collects one or more samples, such as three samples D1 through D3 to provide an example as illustrated in FIG. 3A, of the error signal 154.

At step 304 as illustrated in FIG. 3B, the operational control flow determines the trend of the error signals 154 from the one or more collected samples from step 302 to determine the trend of the error signal 154. As illustrated in FIG. 3A, the one or more collected samples from step 302 are increasing indicating the frequency $f_{OUT}$ is converging with the frequency $f_{REF}$ indicating the positive trend 202.

At step 306 as illustrated in FIG. 3B, the operational control flow continues to monitor the error signal 154. In an exemplary embodiment, the operational control flow collects one or more additional samples, such as samples $D_{N-1}$ and $D_N$ as illustrated in FIG. 3A to provide an example, of the error signal 154. Thereafter, the operational control flow compares the one or more collected additional samples with the trend of the error signal 154 from step 304. The operational control flow determines the trend of the error signal 154 has changed when the one or more collected additional samples differ from the initial trend of the error signal 154 from step 304. For example, as illustrated in FIG. 3A, the trend of the error signal 154 is the positive trend 202 indicated by the "plus" references corresponding to the three samples D1 through D3. In this example, the operational control flow collects the sample $D_{N-1}$ and compares this sample to the positive trend 202. Because the sample $D_{N-1}$ continues with the positive trend 202, namely greater than the last of the three samples D1 through D3, no change in the trend of the error signal 154 is detected. The operational control flow remains in step 306 to collect the sample $D_N$ and compares this sample to the positive trend 202. Because the sample $D_N$ does not continue with the positive trend 202 as indicated by the "minus" reference corresponding to the sample $D_N$, the operational control flow detects the change in the trend of the error signal 154 and proceeds to step 308. The sample $D_N$ is less than the sample $D_{N-1}$ indicating the frequency $f_{OUT}$ is diverging from the frequency $f_{REF}$. The error signal 154 is trending from the positive trend 202 to the negative trend 204 and/or the flat trend 208.

At step 308 as illustrated in FIG. 3B, the operational control flow switches the mode of operation of the ADPLL 100 from frequency tracking mode of operation to the phase tracking mode of operation or from the phase tracking mode of operation to the frequency tracking mode of operation in response to detecting the change in the trend of the error signal 154 in step 306. Additionally, the operational control flow provides a control signal, such as the TDC enable signal 166 to provide an example, to enable or disable the TDC 108. Thereafter, the operational control flow reverts to step 306 to continue to monitor the error signal 154 for other changes in the trend of the error signal 154.

Exemplary Controller that can be Implemented within the ADPLL

Figure 4:
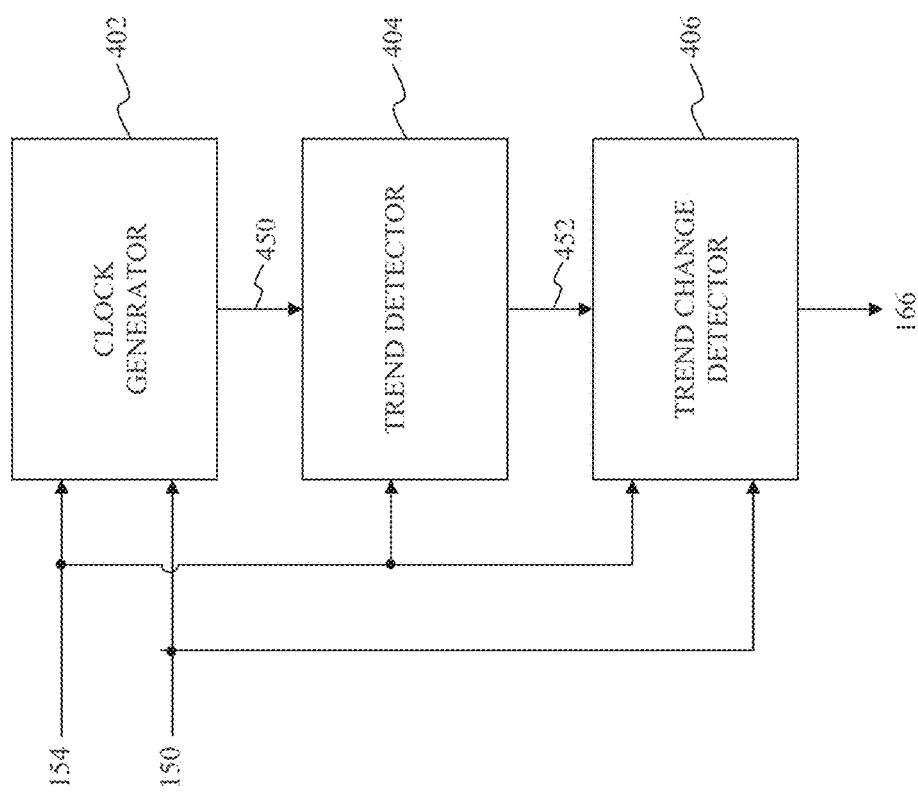
FIG. 4 is a block diagram illustrating an exemplary implementation of a controller that can be implemented with the ADPLL in accordance with an embodiment of the present disclosure.

FIG. 4 is a block diagram illustrating an exemplary implementation of a controller that can be implemented with the ADPLL in accordance with an embodiment of the present disclosure. A controller 400 configures an ADPLL, such as the ADPLL 100 to provide an example, to operate in the frequency tracking mode of operation or the phase track mode of operation. The controller 400 can configure the ADPLL to switch among the frequency tracking mode of operation or the phase track mode of operation in response to detecting a change in a trend of the error signal 154. The controller 400 includes a clock generator 402, a trend detector 404, and a trend change detector 406. The controller 400 can represent an exemplary embodiment of the controller 100.

The clock generator 402 determines a trend clocking signal 450 based upon the digital reference input signal 150 and the error signal 154. The trend clocking signal 450 is used to capture the error signal 154 for use with the trend detector 404 and the trend change detector 452. In an exemplary embodiment, the clock generator 402 monitors the error signal 154 and switches the trend clocking signal 450 between logical values when the error signal 154 changes in response to adjustment of the frequency $f_{OUT}$ and/or the phase $\phi_{OUT}$. For example, the clock generator 402 causes the trend clocking signal 450 to be at a first logical level when the error signal 154 is at a first digital value. The clock generator 402 holds the trend clocking signal 450 at the first logical level until the error signal 154 changes to a second digital value, different from the first, whereby the clock generator 402 switches the trend clocking signal 450 from the first logical level to a second logical level. In another exemplary embodiment, this change in logical levels of the trend clocking signal 450 occurs during a rise edge or a falling edge of the first time-varying signal of the digital reference input signal 150.

The trend detector 404 collects one or more samples, such as three samples D1 through D3 to provide an example, of the error signal 154 in accordance with the trend clocking signal 450 to provide a trend indicator 452. The trend indicator 452 indicates whether the collected one or more samples of the error signal 154 have a positive trend, a flat trend, and/or a negative trend.

The trend change detector 406 compares the trend indicator 452 with a previous trend indicator to determine whether the trend of the error signal 154 has changed. The operational control flow determines the trend of the error signal 154 has changed when the trend indicator 452 differs from the previous trend indicator. In response to this difference, the trend change detector 406 provides a control signal, such as the TDC enable signal 166, to initiate a change in the tracking mode, for example, from the frequency track mode of operation to the phase tracking mode of operation.

Figure 5:
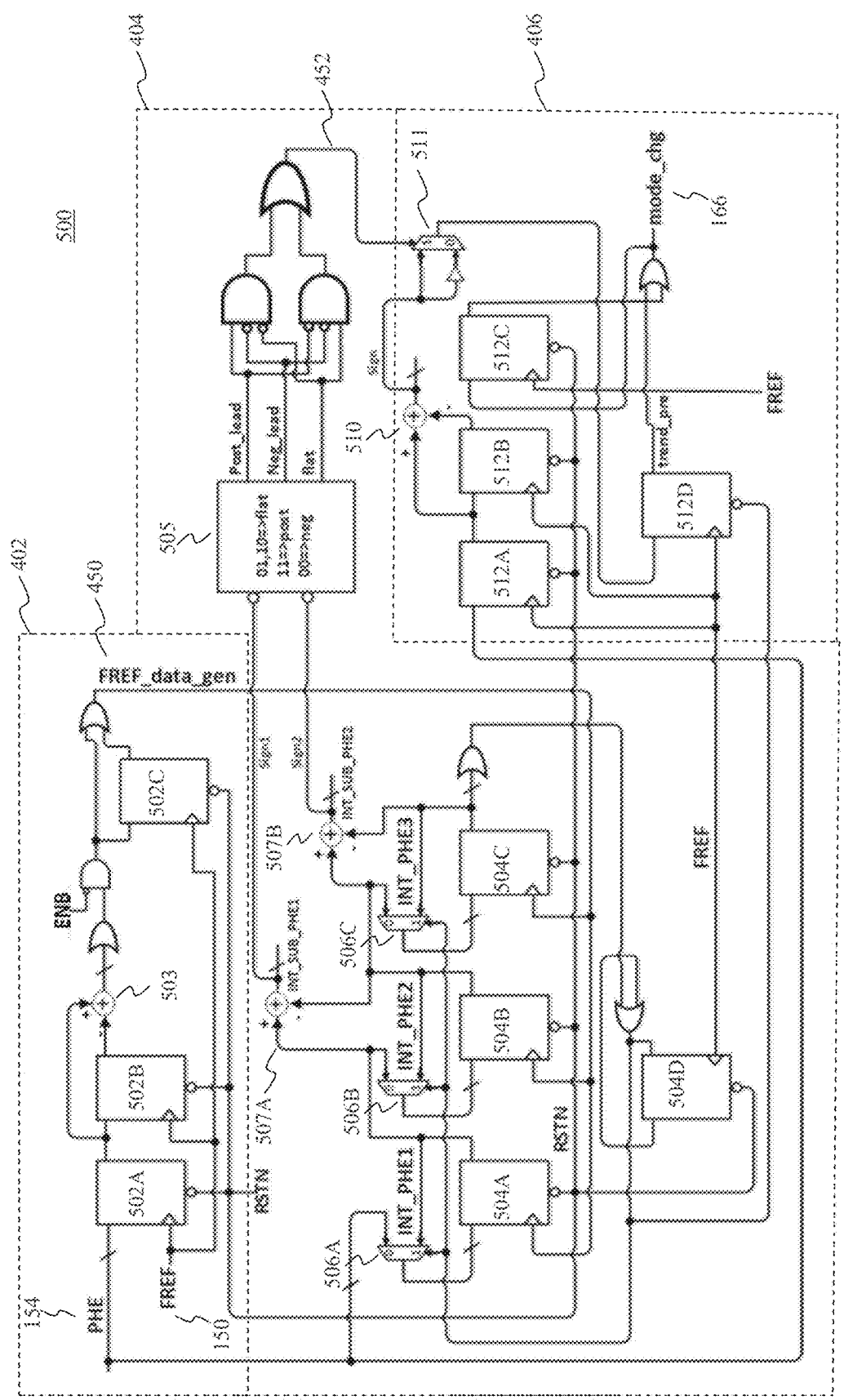
FIG. 5 is a more detailed diagram illustrating an exemplary implementation of the controller in accordance with an embodiment of the present disclosure.

FIG. 5 is a more detailed diagram illustrating an exemplary implementation of the controller in accordance with an embodiment of the present disclosure. As shown in FIG. 5, a controller 500 contains the clock generator 402, the trend detector 404, and the trend change detector 406.

The clock generator 402 includes multiple logical gates, such as flip flops, logical OR gates, and logical AND gates to determine the trend clocking signal 450 based upon the digital reference input signal 150 and the error signal 154 as discussed above in FIG. 4. As illustrated in FIG. 5, the clock generator 402 includes flip flops 502A through 502C and a digital combination network 503. The flip flops 502A and 502B, using input signal 150 as clocking signal, store samples of data received from the error signal 154. The digital combination network 503 determines a difference between the samples of data and forwards the determined difference to the flip flop 502C through a series of logical OR and logical AND gates. The flip flop 502C receives the determined difference and using input signal 150 as clocking signal, generates the trend clocking signal 450.

The trend detector 404, using the trend clocking signal 450, can determine a trend between three samples of the error signal 154 (represented as INT_PHE1, INT_PHE2, and INT_PHE3, respectively, in FIG. 5). As explained in details below, the trend detector 404 determines the difference between the samples of data (e.g., between INT_PHE1 and INT_PHE2 and between INT_PHE2 and INT_PHE3) using two digital combination networks and determines two respective signs indicative of these differences. Based on these determined signs, the trend detector 404 provides the trend indicator 452.

As illustrated in FIG. 5, the trend detector 404 includes logical OR gates, logical AND gates, flip flops 504A through 504D, a trend code generator 505, multiplexers 506A through 506C and digital combination networks 507A through 507B. The flip flops 504A through 504C use the trend clocking signal 450 as a clocking signal and store three samples of data from the error signal 154, represented as INT_PHE1, INT_PHE2, and INT_PHE3, respectively. The multiplexers 506A through 506C are respectively connected to flip flops 504A through 504C, while the flip flop 504D is connected to the output of flip flop 504C through a series of logical OR gates. If the flip flop 504C has not received a sample of data, it sends out an instruction signal through the flip flop 504D to multiplexers 506A through 506C. Each multiplexer from among the multiplexers 506A through 506C then forwards samples of data through the chain of flip flops 504A through 504C, until INT_PHE1, INT_PHE2, and INT_PHE3 are stored in flip flops 504A through 504C respectively. The digital combination network 507A receives INT-PHE1 and INT_PHE2 from flip flop 504A and 504B respectively, and generates a single bit output code Sign1 indicative of a sign between samples of data INT-PHE1 and INT_PHE2. Similarly, the digital combination network 507B generates a single bit output code Sign2 indicative of a sign between samples of data INT-PHE2 and INT_PHE3. The Sign1 and Sign2 forms a two-bit code indicating a trend of the stored three samples of data. For example, a two-bit code of 11 would indicate a positive trend, a two bit code of 00 would indicate a negative trend, while 01 or 10 would indicate a flat trend. The trend code generator 505 receives the two bit code, and using the connected logical AND gates and logical OR gate, generates the trend indicator 452. The trend indicator 452 may be a single bit code, indicating the trend of the stored three samples of data. For example, a single bit of 1 would indicate a positive or flat trend, while a single bit of 0 would indicate a negative trend.

The trend change detector 406 uses the trend indicator 452 and the error signal 154 to determine when a change in trend has occurred. For example, trend change detector 406 can determine when the sign between adjacent data no longer matches the sign detected by the trend detector 404. Similar to the operation of flip flops 504A and 504B and digital combination network 507A, flip flops 512A and 512B receive and store two samples of data from the error signal 154, and a digital combination network 510 further determines a sign between the adjacent two samples of data. When the determined sign is different from trend indicator 452, the trend change detector 406 detects this change and a multiplexer 511 outputs the TDC enable signal 166 to initiate a change in tracking mode. To prevent data glitch in the detector system and provide more reliable detection in trend changes, the flip flops 512C and 512D may be used to further process the TDC enable signal 166, in accordance with some embodiments. For example, the flip flop 512D may be a D-type flip flop that is configured to receive and output the TDC enable signal 166. The flip flop 512D may further comprise a reset signal input for asynchronously clearing the output of the flip flop 512D if its reset signal is set to 0. As shown in FIG. 5, the reset signal input may be provided by the flip flop 504C of trend detector 404, and the flip flop 512D would therefore be enabled to output the TDC enable signal 166 only after samples of data have been respectively stored in the flip flops 504A through 504C. The flip flop 512C and the connected logical OR gates are configured to form a feedback loop and maintain the output of the trend change detector 406 during operation.

CONCLUSION

The foregoing Detailed Description discloses a phase lock loop (PLL) controller. The PLL controller includes a clock generator that receives an error signal from a PLL, the error signal representing a difference between a frequency or a phase of a reference input signal of the PLL and a frequency or a phase of an output signal of the PL and generates a clock signal based on the error signal. The PLL controller additional includes a trend detector that samples the error signal in accordance with the clock signal and determines a trend of the sampled error signal. The PLL controller further includes a trend change detector that compares the trend of the sampled error signal to a previous trend of the sampled error signal and initiates a change in a mode of operation of the PLL upon detecting a change in the trend of the sampled error signal.

The foregoing Detailed Description additional discloses an all-digital phase lock loop (ADPLL), The ADPLL includes a phase frequency detector (PFD) that compares a first frequency of a first time-varying signal represented by a digital reference input signal and a second frequency of a second time-varying signal represented by a digital output signal to provide a frequency error component of an error signal and a time-to-digital converter (TDC) configured that compares a first phase of the first time-varying signal and a second phase of the second time-varying signal to provide a phase error component of the error signal. The ADPLL additionally includes a digital controlled oscillator (DCO) that adjusts the second frequency and the second phase based upon the error signal and a controller that monitors the error signal and disables or enables the TDC upon detecting a change in the trend of the error signal.

The foregoing Detailed Description further discloses a method for operating a phase lock loop (PLL). The method includes receiving an error signal from the PLL, the error signal representing a difference between a frequency or a phase of a reference input signal of the PLL and a frequency or a phase of an output signal of the PLL, sampling the error signal, determining a trend of the sampled error signal, comparing the trend of the sampled error signal to a previous trend of the sampled error signal, and initiating a change in a mode of operation of the PLL upon detecting a change in the trend of the sampled error signal.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
    a trend detector configured to determine a trend of a signal;
    a trend change detector configured to initiate a change in a mode of operation of the apparatus in response to detecting a change in the trend of the signal; and
    a clock generator configured to:
        determine a trend clocking signal based on a reference input signal and the signal;
        provide the trend clocking signal at a first logical level in response to the signal being at a first digital value,
        hold the trend clocking signal at the first logical level until the signal changes to a second digital value, and
        switch the trend clocking signal from the first logical level to a second logical level in response to the signal changing to the second digital value;
        wherein the trend detector is configured to sample the signal based on the trend clocking signal.

2. The apparatus of claim 1, wherein the trend comprises:
    a positive trend;
    a negative trend; or
    a flat trend.

3. The apparatus of claim 1, wherein the signal represents a difference between the reference input signal and an output signal of the apparatus, and wherein the apparatus comprises a phase lock loop configured to:
    adjust a frequency of the output signal to be proportional to a frequency of the reference input signal in a frequency tracking mode of operation, and
    adjust a phase of the output signal to match a phase of the reference input signal in a phase tracking mode of operation, and
    wherein the trend change detector is further configured to switch a mode of operation of the apparatus between the frequency tracking mode of operation and the phase tracking mode of operation in response to detecting the change in the trend of the sampled signal.

4. The apparatus of claim 3, further comprising:
    a phase frequency detector (PFD) configured to compare the frequency of the reference input signal and the frequency of the output signal to provide a frequency difference of the signal in the frequency tracking mode of operation and in the phase tracking mode of operation.

5. The apparatus of claim 4, further comprising:
    a time-to-digital converter (TDC) configured to:
        compare the phase of the reference input signal and the phase of the output signal to provide a phase difference of the signal in the phase tracking mode of operation, and
        be disabled in the frequency tracking mode of operation.

6. The apparatus of claim 1, wherein the apparatus further comprises an all-digital phase lock loop (ADPLL).

7. The apparatus of claim 1, wherein the trend detector is further configured to sample the signal from the apparatus received in a frequency tracking mode of operation, the signal representing a difference between a reference input signal of the apparatus and an output signal of the apparatus.

8. The apparatus of claim 1, wherein the mode of operation comprises a phase tracking mode of operation or a frequency tracking mode of operation.

9. A method for operating an apparatus, the method comprising:
    sampling a signal from the apparatus received in a frequency tracking mode of operation, the signal representing a difference between a reference input signal of the apparatus and an output signal of the apparatus;
    determining a trend clocking signal based on the reference input signal and the signal, wherein the signal is sampled based on the trend clocking signal;
    detecting a change in a trend of a signal, wherein the trend comprises:
        a positive trend;
        a negative trend; and
        a flat trend; and
    initiating a change in a mode of operation of the apparatus from the frequency tracking mode of operation to a phase tracking mode of operation in response to detecting the change in the trend of the signal.

10. The method of claim 9, wherein the determining the trend clocking signal comprises:
    providing the trend clocking signal at a first logical level in response to the signal being at a first digital value,
    holding the trend clocking signal at the first logical level until the signal changes to a second digital value, and
    switching the trend clocking signal from the first logical level to a second logical level in response to the signal changing to the second digital value.

11. The method of claim 9, further comprising:
adjusting a frequency of the output signal to be proportional to a frequency of the reference input signal in a frequency tracking mode of operation;
adjusting a phase of the output signal to match a phase of the reference input signal in the phase tracking mode of operation; and
switching a mode of operation of a phase lock loop between the frequency tracking mode of operation and the phase tracking mode of operation in response to detecting the change in the trend of the signal.

12. The method of claim 11, wherein the adjusting the frequency of the output signal comprises:
comparing the frequency of the reference input signal and the frequency of the output signal to provide a frequency difference of the signal in the frequency tracking mode of operation and in the phase tracking mode of operation.

13. The method of claim 12, wherein the adjusting the phase of the output signal comprises:
comparing the phase of the reference input signal and the phase of the output signal to provide a phase difference of the signal in the phase tracking mode of operation.

14. The method of claim 9, wherein the reference input signal represents a digital representation of a first time-varying signal having a first frequency and a first phase,
wherein the output signal represents a digital representation of a second time-varying signal having a second frequency and a second phase.

15. An apparatus, comprising:
a clock generator configured to:
receive a signal, wherein the signal represents a difference between a frequency or a phase of a reference input signal of the apparatus and a frequency or a phase of an output signal of the apparatus,
generate a clock signal based on the signal, and
collect a plurality of samples of the output signal and to switch logical levels of the clock signal in response to changes between the plurality of samples;
a trend detector configured to:
sample the signal based on the clock signal, and
determine a trend of the sampled signal; and
a trend change detector configured to:
compare the trend of the sampled signal to a previous trend of the sampled signal to detect a change in the trend of the sampled signal, and
initiate a change in a mode of operation of the apparatus in response to detecting the change in the trend of the sampled signal.

16. The apparatus of claim 15, wherein the reference input signal and the output signal comprise a digital reference input signal and a digital output signal, respectively.

17. The apparatus of claim 15, wherein the reference input signal represents a digital representation of a first time-varying signal having a first frequency and a first phase,
wherein the output signal represents a digital representation of a second time-varying signal having a second frequency and a second phase,
wherein the apparatus comprises a phase lock loop configured to adjust the second frequency to be proportional to the first frequency in a frequency tracking mode of operation and to change to a phase tracking mode of operation in response to the change in the mode of operation of the apparatus to adjust the second phase to be proportional to the first phase.

18. The apparatus of claim 15, wherein the trend of the sampled signal comprises:
a positive trend;
a negative trend; or
a flat trend.

19. The apparatus of claim 15, wherein the apparatus further comprises:
an all-digital phase lock loop (ADPLL).

20. The method of claim 14, further comprising adjusting the second frequency to be proportional to the first frequency in the frequency tracking mode of operation and to change to the phase tracking mode of operation in response to the change in the mode of operation of the apparatus to adjust the second phase to be proportional to the first phase.

* * * * *